(12) United States Patent
Chen et al.

(10) Patent No.: US 6,392,425 B1
(45) Date of Patent: May 21, 2002

(54) MULTI-CHIP PACKAGING HAVING NON-STICKING TEST STRUCTURE

(75) Inventors: April Chen, Taichung; Chih-Chin Liao, Changhwa Hsien; Tzong-Dar Her, Taichung, all of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/475,005

(22) Filed: Dec. 30, 1999

(51) Int. Cl.$^7$ ................................................. G01R 31/02
(52) U.S. Cl. ........................................................ 324/754
(58) Field of Search ................................. 324/754, 537, 324/538, 765

(56) References Cited

U.S. PATENT DOCUMENTS 5,712,570 A * 1/1998 Heo et al. ................... 324/538

\* cited by examiner

*Primary Examiner*—N. Le
*Assistant Examiner*—Etienne P LeRoux
(74) *Attorney, Agent, or Firm*—J.C. Patents

(57) ABSTRACT

A multi-chip packaging substrate having a non-sticking test structure consists of a plurality of non-sticking test spots formed in the periphery zone outside the chip-packaging zone of a multi-chip packaging substrate. Each of these non-sticking test spots is electrically connected to an adjacent one of a plurality of chip pads respectively in the chip packaging zone through a plurality of conductive traces while there are no electrical connections connected one another among the chip pads.

6 Claims, 2 Drawing Sheets

MULTI-CHIP PACKAGING HAVING NON-STICKING TEST STRUCTURE

BACKGROUND OF THE INVENTION

1. Field of the Invention

This invention relates to a multi-chip packaging (MCP) substrate having non-sticking test structure, and more particularly to a multi-chip packaging substrate having non-sticking test structure of "Ball Grid Array" (BGA) type.

2. Description of Related Art

In the light of the trend of "Light, Thin, Short, and Small" of the electronic product, in only as short as a decade, the chip packaging technology of semiconductor has developed from the "Insertion Mount" type in 1980s to the "Chip Scale Package (CSP) technology of today. The "Insertion Mount" type of chip packaging simply mounts the chip on the Print Circuit Board (PCB) while the "Chip Scale Package (CSP) technology has high density of electronic devices and is also in three dimensions instead of the two-dimensional package that were made previously.

During the course of the development of the packaging technology, the BGA package has imperceptibly become the main stream of packaging type nowadays, particularly, the BGA package having Multi-Chip Module (MCM) has been the principal research and development target of large corporations in the field of IC packaging.

FIG. 1 is a schematic top view of a substrate for the ball grid array package having single chip according to the prior art. FIG. 1A is a schematic cross-sectional view illustrates the fabricating process that a chip and a substrate are performing wire bonding. As shown in FIG. 1 and FIG. 1A, a molding gate 110, which is used as an injecting gate of molding compound for injection molding during the encapsulating process, is employed as a non-sticking test spot 110. Besides, the molding gate, which is provided on the substrate, is also used to facilitate separating the molded BGA type package from the substrate after molding. The chip pad 102 is electrically connected to the non-sticking test spot 10 through a conductive trace 104, and a plurality of bonding fingers is disposed at the periphery of the chip pad 102.

After a chip 114 is bonded on the chip pad 102, a wire bonding process is performed to make the chip 114 and the bonding finger 112 of the BGA type packaging substrate 100 electrically connected. The bond wire 116 acts as electrical connection between the chip 112 and BGA packaging substrate 100. In general, during the course of wire bonding, after the bond wire 116 forming a first bond on the bonding pad 118 of the chip 114, a "non-sticking test" is performed. The purpose of the test is to check if the electrical connection between the first bond and the bonding pad 118 of the chip 114 is in good condition, in other words, to make sure whether the phenomena of "Missing Wire" or "Lift Bond" occurs between them.

A non-sticking test spot 110 is formed in a periphery zone 108 outside the chip-packaging zone, and an electroconductive trace 104 is formed on the BGA packaging substrate 100. For the non-sticking test, usually an electroconductive trace 104 is used to make the chip 114 and the non-sticking test spot 110 form an electrical connection through the chip pad 102. Thereafter, the chip 114 is electrified, and the non-sticking test spot 110 is probed to check the existence of electric current. Whether or not there is electric current existed at the non-sticking test spot 110 is used to judge the condition of electrical connection between the first bond formed on the bonding pad 118 of the chip 114 and the bonding pad 118 itself. Normally, the non-sticking test spot 110 is the molding gate, and the method to judge the condition of the electrical connection between first bond and the bonding pad 118 was disclosed in the U.S. Pat. No. 5,712,570.

FIG. 2 is a schematic top view of a substrate for the ball grid array package having multi-chip according to the prior art. As shown in FIG. 2, a multiple of the chip pads 202a, 202b, 202c, and 202d are electrically connected to the molding gate 210 respectively through the conductive traces 204, 204c, 204b and 204a. After all the chips are bonded to the chip pads 202a, 202b, 202c, and 202d of a BGA packaging substrate 200, similarly, a wire bonding process is performed to make the chips and the BGA packaging substrate 200 electrically connected.

The bond wire is used for electrically connecting the chip to the BGA packaging substrate 200. During the course of wire bonding, after the bond wire forming a first bond on the bonding pads of the chip respectively, a "non-sticking test" is performed. Again, the purpose of the test is to check if the electrical connection between the first bond and the bonding pads of the chip is in good condition.

The foregoing method for BGA package having single chip uses the molding gate 210 in the periphery zone 208 outside the chip-packaging zone 206 as the sole non-sticking test spot of the non-sticking test. However, if one still employs the foregoing method for BGA package having single chip, then these chip pads 202a, 202b, 202c, and 202d must share a non-sticking test spot. Therefore, a multiple of conductive traces 204a, 204b, and 204c must be used to form electrical connection among the chip pads 202a, 202b, 202c, and 202d. And then another conductive trace 204 is used to electrically connect these chip pads to the molding gate 210 of the non-sticking test spot. These conductive traces 204a, 204b, and 204c, also called ground traces, will make the ground signals of the multi-chip in the multi-chip package connect together.

However, when the chips are under operation, the ground signals will be interfered one another that will cause problems for the chips if the circuit is not designed for a single ground signal. This is because that when the chips are under operation, the chips in the package are connected by the grounded conductive traces. Therefore, the circuit design of the non-sticking test spot of the multi-chip package's non-sticking test using only the "molding gate" can only be applied in the circuit design for a single ground signal.

The above-mentioned problems can be resolved by removing or cutting off these grounded conductive traces. However, since these grounded conductive traces are designed to form in a chip-packaging zone having narrow and small space, the work of removing and cutting off the traces are not an easy one to perform.

Additionally, as far as the multi-chip packaging (MCP) is concerned, the circuit design having only a single non-sticking test spot has to use a multiple of conductive traces in order to connect the ground signals together among the chips. Consequently, a "wiring-around design" is necessary which will make the circuit design in a very narrow and small space even more complicated and difficult

SUMMARY OF THE INVENTION

According to the above-mentioned statements, the conventional multi-chip packaging substrate has the disadvantage of using only a circuit design for a single non-sticking test spot that results in the inability to be applied in a multi-chip packaging having two or more than two different ground signals. Besides, the disadvantage also the circuit design even more complicated and difficult. Therefore, in the light of the foregoing disadvantages, the present invention provides a multi-chip packaging substrate to resolve the above-mentioned problems.

The present invention provides a multi-chip packaging substrate having a non-sticking test structure. The multi-chip packaging substrate comprises a packaging substrate, a plurality of non-sticking test spots, a molding gate, a plurality of first conductive traces, and a plurality of second conductive traces. The packaging substrate has a chip-packaging zone and a periphery zone wherein the chip-packaging zone has a plurality of chip pads. The plurality of non-sticking test spots is disposed in the periphery zone of the packaging substrate. The molding gate is also disposed in the periphery zone of the packaging substrate. The plurality of first conductive traces is disposed on the packaging substrate for making each of the chip pads electrically connect to each of the adjacent non-sticking test spot respectively. And the plurality of second conductive traces is disposed on the periphery of the packaging substrate for making each of the non-sticking test spot electrically connect to one another.

The present invention is to form a plurality of non-sticking test spots in the periphery zone outside the chip-packaging zone of a multi-chip packaging substrate. Each of these non-sticking test spots is electrically connected to an adjacent one of a plurality of chip pads respectively in the chip packaging zone through a plurality of conductive traces while there are no electrical connection one another among the chip pads.

The present invention makes each of the chip pads electrically connected to each of the non-sticking test spots through a conductive trace while there are no electrical connection one another among the chip pads. In spite of the fact that these non-sticking test spots will become electrically connected through the conductive trace which make each of the chips commonly grounded one another during the non-sticking test. However, after the packaging process is completed, these non-sticking test spots will all be removed. Therefore, each of the chips will not be commonly grounded one another any more. Consequently, the ground signals of each of the chips under operation will not be interfered one another that will further improve the devices' reliability under operation.

Besides, the present invention does not need to connect each of the chips by the conductive trace, thereby, there is no need to employ the "wiring-around design". As far as the very narrow and small packaging space of a multi-chip package is concerned, the present invention provides a simple and flexible circuit design.

BRIEF DESCRIPTION OF DRAWINGS

The objectives, characteristics, and advantages of the present invention can be more fully understood by reading the following detailed description of the preferred embodiments, with reference made to the accompanying drawings as follows.

DESCRIPTION OF PREFERRED EMBODIMENT

Figure 1:
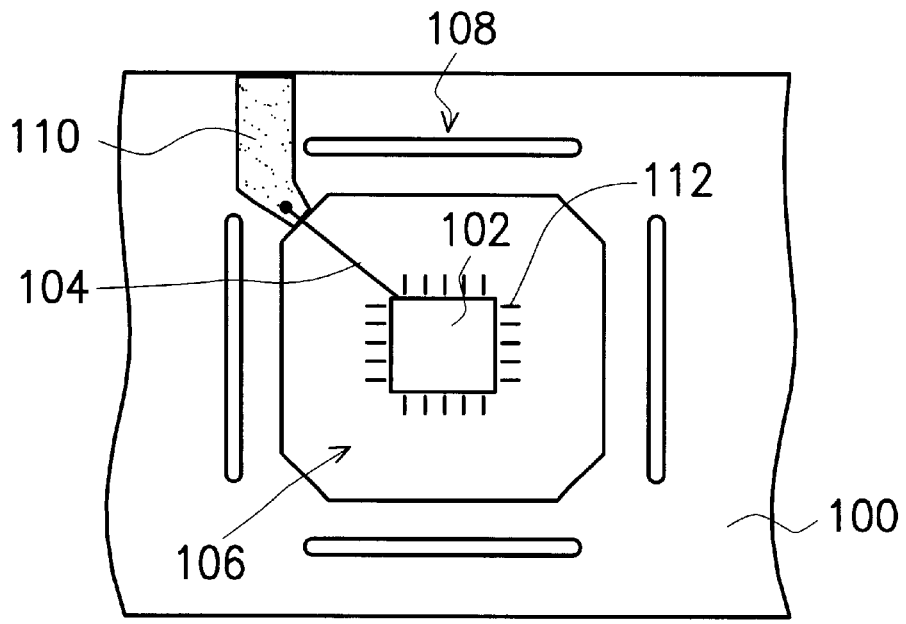
FIG. 1 is a schematic top view of a substrate for the ball grid array package having single chip according to the prior art.
Figure 1A:
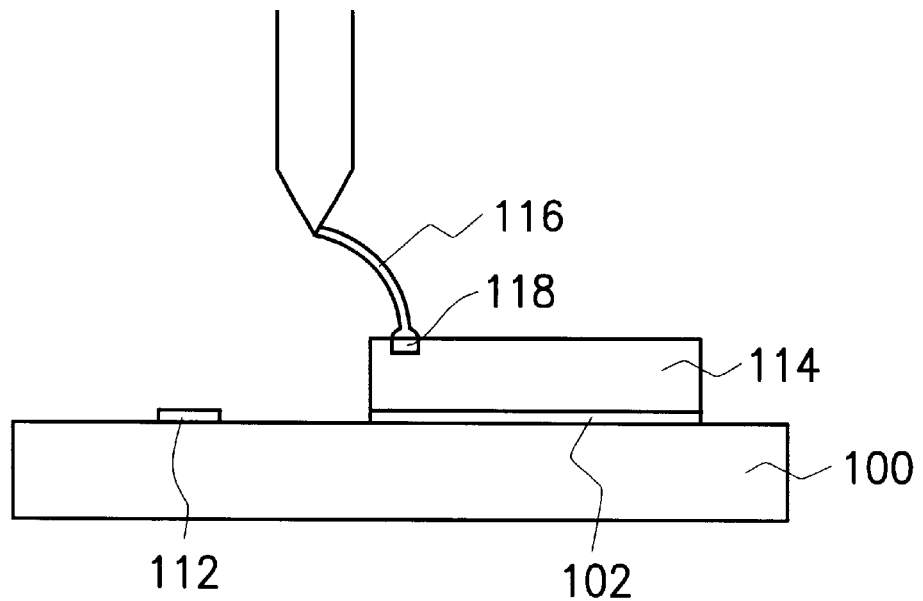
FIG. 1A is a schematic cross-sectional view illustrates the fabricating process that a chip and a substrate are performing wire bonding.
Figure 2:
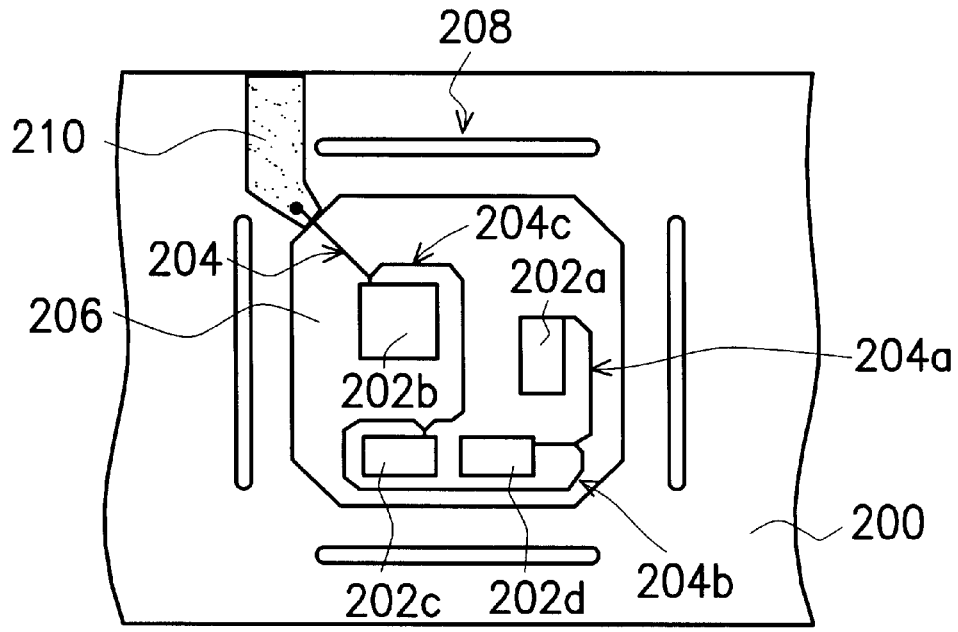
FIG. 2 is a schematic top view of a substrate for the ball grid array package having multi-chip according to the prior art.
Figure 3:
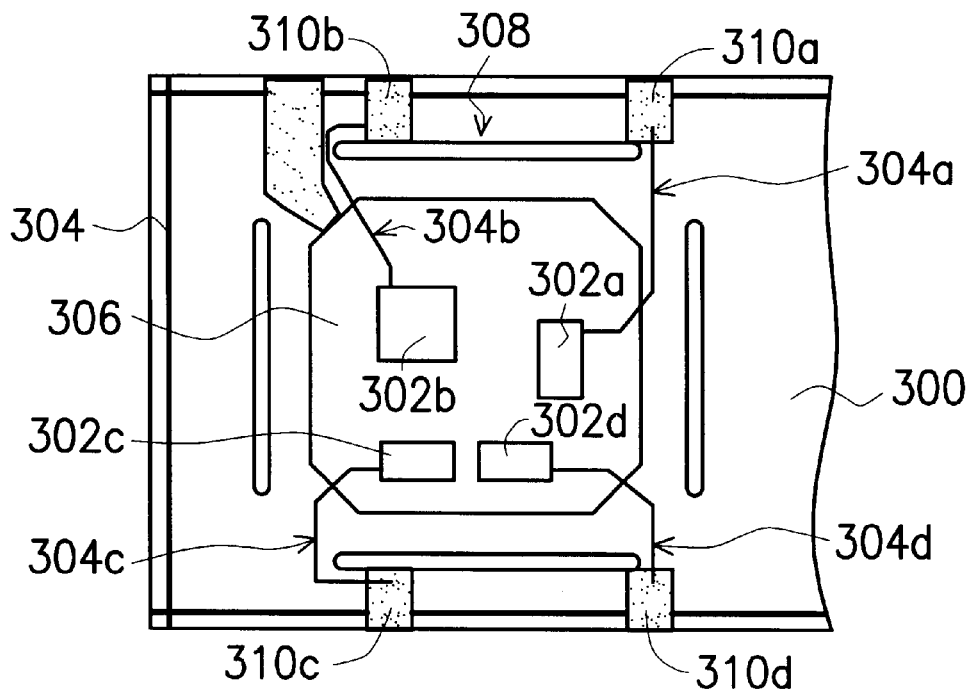
FIG. 3 is a schematic top view of a substrate for the ball grid array package having multi-chip according to a preferred embodiment of the present invention.

FIG. 3 is a schematic top view of a substrate for the ball grid array package having multi-chip according to a preferred embodiment of the present invention. As shown in FIG. 3, a multiple of the chip pads 302a, 302b, 302c, and 302d are electrically connected to the non-sticking test spots 310a, 310b, 310c, and 310d through the conductive traces 304a, 304b, 304c, and 304d respectively. After all the chips are bonded to the chip pads 302a, 302b, 302c, and 302d of a packaging substrate 300, a wire bonding process is performed to make the chips and the packaging substrate 300 electrically connected.

The bond wires are used for electrically connecting the chips to the BGA packaging substrate 300. During the course of wire bonding, after the bond wire forming a first bond on the bonding pads of the chip respectively, a "non-sticking test" is performed. Again, the purpose of the test is to check if the electrical connection between the first bond and the bonding pads of the chip is in good condition., in other words, to make sure whether the phenomena of "Missing Wire" or "Lift Bond" occurs between them. The packaging substrate 300 can be of a Ball Grid Array type for example.

For the non-sticking test, the electroconductive traces 304a, 304b, 304c, and 304d are used to make the chips electrically connected to a multiple of non-sticking test spots 310a, 310b, 310c, and 310d respectively through the chip pads 302a, 302b, 302c, and 302d. These non-sticking test spots 310a, 310b, 310c, and 310d are formed in the periphery zone 308 outside the chip-packaging zone 306. Thereafter, the chip is electrified respectively, and these non-sticking test spots 310a, 310b, 310c, and 310d are probed to check the existence of electric current. Whether or not there is electric current existed at each of the non-sticking test spots 310a, 310b, 310c, and 310d is used to judge the condition of electrical connection between the first bond formed on the bonding pad of the chip and the bonding pad itself.

The formed positions of these non-sticking test spots 310a, 310b, 310c, and 310d are in the periphery zone 308 outside the chip-packaging zone 306, and are disposed at the locations adjacent to the corresponding locations of those chip pads 302a, 302b, 302c, and 302d.

Moreover, these non-sticking test spots 310a, 310b, 310c, and 310d are electrically connected to the molding gate 310 through a conductive trace 304 formed in a periphery zone 308. The purpose of these connections is to form a conductive layer such as gold layer on the surfaces of the non-sticking test spots 310a, 310b, 310c, and 310d as well as the bonding fingers (not shown) during the electroplating process performed previously in order to enhance their electroconductivity.

Subsequently, after the packaging process is completed, all the non-sticking test spots 310a, 310b, 310c, and 310d and the conductive trace 304 will be cut off. Therefore, after the packaging process is completed, the chip pads 302a, 302b, 302c, and 302d are not grounded together with the conductive traces 304a, 304b, 304c, and 304d. Consequently, the subsequent ground signals of each of the chips will not be interfered one another.

The present invention is to form a plurality of non-sticking test spots in the periphery zone outside the chip-packaging zone of a multi-chip packaging substrate. Each of these non-sticking test spots is electrically connected to an adjacent one of a plurality of chip pads respectively in the chip packaging zone through a plurality of conductive traces while there are no electrical connections one another among these chip pads.

The present invention makes each of the chip pads electrically connected to each of the non-sticking test spots through a conductive trace while there are no electrical connections one another among the chip pads. In spite of the fact that these non-sticking test spots will become electrically connected through the conductive trace which make each of the chips commonly grounded one another during the non-sticking test. However, after the packaging process is completed, these non-sticking test spots will all be removed. Therefore, each of the chips will not be commonly grounded one another any more. Consequently, the ground signals of each of the chips under operation will not be interfered one another that will further improve the devices' reliability under operation.

Besides, the present invention does not need to connect each of the chips by the conductive trace, thereby, there is no need to employ the "wiring-around design". As far as the very narrow and small packaging space of a multi-chip package is concerned, the present invention provides a simple and flexible circuit design.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A multi-chip packaging substrate having a non-sticking test structure comprising:
   a packaging substrate, having a chip-packaging zone and a periphery zone wherein the chip-packaging zone has a plurality of chip pads;
   a plurality of non-sticking test spots, disposed in the periphery zone of the packaging substrate; and
   a plurality of conductive traces, disposed on the packaging substrate for making each of the chip pads electrically connect to each of the adjacent non-sticking test spots respectively, wherein there are no electrical connections between any of the chip pads.

2. The multi-chip packaging substrate having a non-sticking test structure of claim 1 wherein the packaging substrate further comprises a substrate for Ball Grid Array (BGA) packaging.

3. The multi-chip packaging substrate having a non-sticking test structure of claim 1 wherein the packaging substrate further comprises a molding gate.

4. The multi-chip packaging substrate having a non-sticking test structure of claim 3 wherein the molding gate is electrically connected to the non-sticking test spots.

5. A multi-chip packaging substrate having a non-sticking test structure comprising:
   a packaging substrate, having a chip-packaging zone and a periphery zone wherein the chip-packaging zone has a plurality of chip pads;
   a plurality of non-sticking test spots, disposed in the periphery zone of the packaging substrate;
   a molding gate, disposed in the periphery zone of the packaging substrate;
   a plurality of first conductive traces, disposed on the packaging substrate for making each of the chip pads electrically connect to each of the adjacent non-sticking test spots respectively, wherein there are no electrical connections between any of the chip pads; and
   a plurality of second conductive traces, disposed in the periphery zone of the packaging substrate for making each of the non-sticking test spots electrically connect to one another.

6. The multi-chip packaging substrate having a non-sticking test structure of claim 5 wherein the packaging substrate comprises a substrate for Ball Grid Array packaging.

* * * * *